United States Patent
Chatani et al.

(10) Patent No.: US 10,515,751 B2
(45) Date of Patent: Dec. 24, 2019

(54) SOFT MAGNETIC MOLDED BODY, MAGNETIC CORE, AND MAGNETIC SHEET

(71) Applicant: TOKIN CORPORATION, Sendai-shi, Miyagi (JP)

(72) Inventors: Kenichi Chatani, Sendai (JP); Kenji Ikeda, Sendai (JP); Toshinori Tsuda, Sendai (JP)

(73) Assignee: TOKIN CORPORATION, Tokyo (JP)

( * ) Notice: Subject to any disclaimer, the term of this patent is extended or adjusted under 35 U.S.C. 154(b) by 597 days.

(21) Appl. No.: 15/126,981

(22) PCT Filed: Mar. 13, 2015

(86) PCT No.: PCT/JP2015/057426
§ 371 (c)(1),
(2) Date: Sep. 16, 2016

(87) PCT Pub. No.: WO2015/141569
PCT Pub. Date: Sep. 24, 2015

(65) Prior Publication Data
US 2017/0117081 A1    Apr. 27, 2017

(30) Foreign Application Priority Data
Mar. 17, 2014  (JP) .................. 2014-053771

(51) Int. Cl.
*H01F 27/255* (2006.01)
*B22F 3/11* (2006.01)
(Continued)

(52) U.S. Cl.
CPC ............ *H01F 27/255* (2013.01); *B22F 1/007* (2013.01); *B22F 1/0055* (2013.01);
(Continued)

(58) Field of Classification Search
None
See application file for complete search history.

(56) References Cited

U.S. PATENT DOCUMENTS 6,054,219 A * 4/2000 Satsu ................. H01F 1/24
427/220
8,268,093 B2 * 9/2012 Nishiuchi ............ H01F 1/0573
148/101
(Continued)

FOREIGN PATENT DOCUMENTS

CN 102693801 A 9/2012
JP 2000030925 A 1/2000
(Continued)

OTHER PUBLICATIONS

International Search Report (ISR) and Written Opinion dated Jun. 2, 2015 issued in International Application No. PCT/JP2015/057426.
(Continued)

*Primary Examiner* — Kevin M Bernatz
(74) *Attorney, Agent, or Firm* — Holtz, Holtz & Volek PC

(57) ABSTRACT

A soft magnetic molded body, in which a binder component is used to bind a soft magnetic metal powder that has a flat shape, includes 60% by volume or more of the soft magnetic metal powder and 10-30% by volume of fine open pores. The binder component includes an inorganic oxide as a main component.

10 Claims, 5 Drawing Sheets

(51) Int. Cl.
*H01F 17/00* (2006.01)
*H01F 1/26* (2006.01)
*B22F 1/00* (2006.01)
*B22F 3/24* (2006.01)
*B22F 9/04* (2006.01)
*C22C 38/02* (2006.01)
*C22C 38/18* (2006.01)
*H01F 1/147* (2006.01)
*H05K 9/00* (2006.01)
*C22C 33/02* (2006.01)

(52) U.S. Cl.
CPC .......... *B22F 1/0074* (2013.01); *B22F 1/0085* (2013.01); *B22F 3/11* (2013.01); *B22F 3/1134* (2013.01); *B22F 3/24* (2013.01); *B22F 9/04* (2013.01); *C22C 33/0257* (2013.01); *C22C 38/02* (2013.01); *C22C 38/18* (2013.01); *H01F 1/14775* (2013.01); *H01F 1/14791* (2013.01); *H01F 1/26* (2013.01); *H01F 17/0033* (2013.01); *H05K 9/0075* (2013.01); *B22F 2003/248* (2013.01); *B22F 2009/043* (2013.01); *B22F 2201/02* (2013.01); *B22F 2301/35* (2013.01); *B22F 2302/256* (2013.01); *B22F 2302/45* (2013.01); *B22F 2998/10* (2013.01); *B22F 2999/00* (2013.01); *C22C 2202/02* (2013.01)

(56) References Cited

U.S. PATENT DOCUMENTS

| | | | |
|---|---|---|---|
| 8,416,051 B2 | 4/2013 | Matsuura et al. | |
| 9,030,285 B2 | 5/2015 | Matsuura et al. | |
| 9,287,033 B2 | 3/2016 | Matsuura et al. | |
| 9,472,341 B2 | 10/2016 | Matsuura et al. | |
| 9,646,756 B2* | 5/2017 | Inagaki | B22F 1/02 |
| 2005/0012652 A1* | 1/2005 | Wakayama | H01F 1/18 |
| | | | 342/1 |
| 2005/0074600 A1* | 4/2005 | Ma | B82Y 25/00 |
| | | | 428/328 |
| 2008/0008897 A1* | 1/2008 | Imagawa | B22F 1/02 |
| | | | 428/546 |
| 2010/0052992 A1* | 3/2010 | Okamura | H01Q 1/526 |
| | | | 343/700 MS |
| 2011/0217543 A1* | 9/2011 | Suetsuna | B32B 5/16 |
| | | | 428/323 |
| 2012/0001710 A1* | 1/2012 | Wakabayashi | B22F 1/0062 |
| | | | 335/297 |
| 2012/0274437 A1 | 11/2012 | Matsuura et al. | |
| 2013/0228716 A1* | 9/2013 | Suetsuna | C22C 29/12 |
| | | | 252/62.55 |
| 2014/0049348 A1 | 2/2014 | Matsuura et al. | |
| 2014/0139311 A1 | 5/2014 | Matsuura et al. | |
| 2014/0218147 A1* | 8/2014 | Chatani | H01F 17/0013 |
| | | | 336/20 |
| 2015/0235753 A1* | 8/2015 | Chatani | H01F 17/0013 |
| | | | 336/200 |
| 2016/0163448 A1 | 6/2016 | Matsuura et al. | |
| 2017/0076845 A1* | 3/2017 | Suetsuna | H01F 1/28 |
| 2018/0258513 A1* | 9/2018 | Suetsuna | H01F 1/24 |

FOREIGN PATENT DOCUMENTS

| | | |
|---|---|---|
| JP | 2002289414 A | 10/2002 |
| JP | 2009259974 A | 11/2009 |
| JP | 2013187481 A | 9/2013 |
| JP | 2013243330 A | 12/2013 |
| JP | 2013247214 A | 12/2013 |
| JP | 5453036 B2 | 3/2014 |

OTHER PUBLICATIONS

Chinese Office Action dated Jan. 22, 2018 issued in counterpart Chinese Application No. 201580014294.6.

Japanese Office Action (and English language translation thereof) dated Dec. 19, 2018 issued in Japanese Application No. 2014-053771.

Japanese Office Action (and English language translation thereof) dated May 30, 2018 issued in Japanese Application No. 2014-053771.

Chinese Office Action (and English language translation thereof) dated Sep. 10, 2018 issued in counterpart Chinese Application No. 201580014294.6.

* cited by examiner

SOFT MAGNETIC MOLDED BODY, MAGNETIC CORE, AND MAGNETIC SHEET

TECHNICAL FIELD

This invention relates to a soft magnetic formed body in which a binder component binds soft magnetic metal particles each having a flat shape.

BACKGROUND ART

Patent Document 1 discloses a magnetic core which is made of this type of soft magnetic formed body.

PRIOR ART DOCUMENTS

Patent Document(s)

Patent Document 1: JP A 2013-243330

SUMMARY OF INVENTION

Technical Problem

The magnetic core, or the soft magnetic formed body, disclosed in Patent Document 1 is deformable to some extent and easy to be used. Such superior soft magnetic formed body is required to be further improved in its characteristics and to be used in wider applications.

It is therefore an object of the present invention to provide a soft magnetic formed body which can satisfy this request.

Solution to Problem

An aspect of the present invention provides a soft magnetic formed body in which a binder component binds soft magnetic metal particles each having a flat shape. The soft magnetic formed body includes the soft magnetic metal particles of 60 volume % or more and open pores between 10 volume % and 30 volume %, both inclusive. The binder component includes an inorganic oxide as a principal component thereof.

Another aspect of the present invention provides a magnetic core made of the soft magnetic formed body.

Still another aspect of the present invention provides a magnetic sheet made of the soft magnetic formed body.

Advantageous Effects of Invention

The soft magnetic formed body according to the present invention includes the soft magnetic metal particles of 60 volume % or more, which are bound by the binder component, and open pores between 10 volume % and 30 volume %, both inclusive. As can be seen from this structure, the most of vacancy inside of the soft magnetic formed body according to the present invention is the open pores each of which is connected to the outside of the soft magnetic formed body. This structure makes the soft magnetic formed body according to the present invention further hardly to be damaged and easy to be used in comparison with the existing soft magnetic formed body.

An appreciation of the objectives of the present invention and a more complete understanding of its structure may be had by studying the following description of the preferred embodiment and by referring to the accompanying drawings.

DESCRIPTION OF EMBODIMENTS

Figure 1:
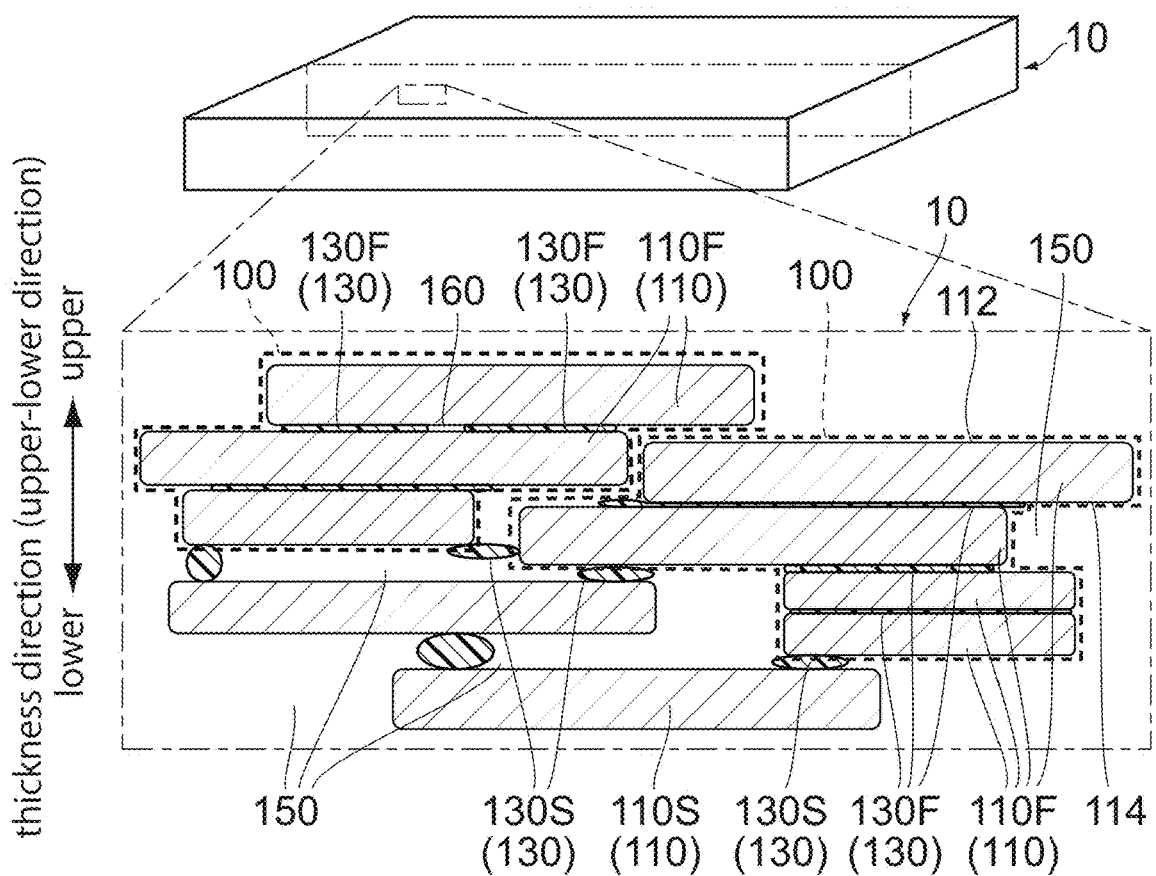
FIG. 1 is a perspective view schematically showing a soft magnetic formed body according to an embodiment of the present invention, wherein a part of a cross-section of the soft magnetic formed body (part enclosed by chain dotted line) is enlarged to be schematically illustrated.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following explanation, a word indicating position such as "upper" and "lower" does not mean an absolute position but only means a relative position in Figures.

Referring to FIG. 1, a soft magnetic formed body 10 according to an embodiment of the present invention has a flat plate shape which is thin in a thickness direction (upper-lower direction). For example, the soft magnetic formed body 10 has a thickness, or a size in the upper-lower direction, about 2 mm. The soft magnetic formed body 10 according to the present embodiment has a rectangular shape in a horizontal plane (predetermined plane) perpendicular to the upper-lower direction. However, the present invention is not limited thereto. The soft magnetic formed body 10 may be shaped in various shapes. For example, the soft magnetic formed body 10 may be shaped in a thin sheet-like shape having a thickness about 0.4 mm.

Figure 3:
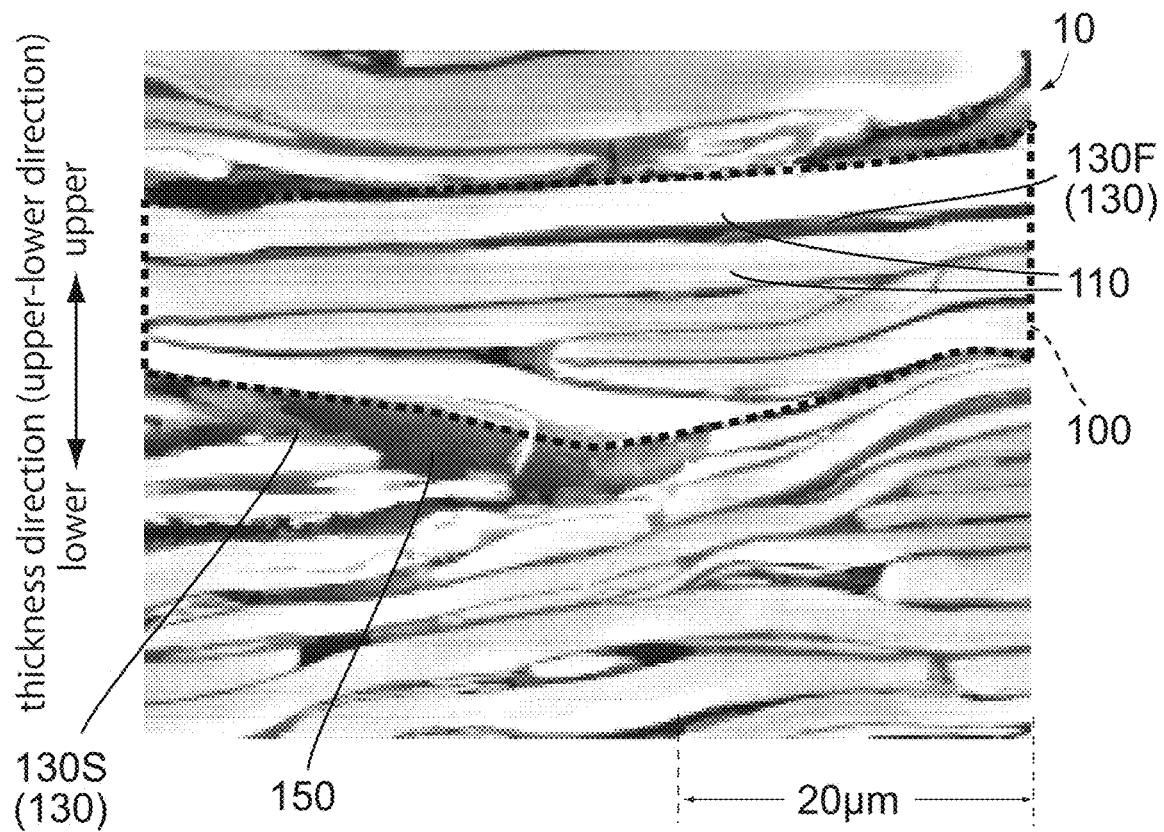
FIG. 3 is an image showing a part of a cross-section of the soft magnetic formed body according to the present embodiment.

Referring to FIGS. 1 and 3, the soft magnetic formed body 10 is an object in which a binder (binder component) 130 binds soft magnetic metal particles (soft magnetic metal material) 110 each having a flat shape. The soft magnetic formed body 10 includes the soft magnetic metal particles 110 of 60 volume % or more, the binder component 130 between 4 volume % and 30 volume %, both inclusive, open pores (vacancy) 150 between 10 volume % and 30 volume %, both inclusive, and a few volume % of closed pores (vacancy) 160. The binder component 130 includes an inorganic oxide as a principal component thereof. For example, the binder component 130 includes silicon oxide as its principal component.

As shown in FIGS. 1 and 3, the soft magnetic formed body 10 includes one or more of masses of particles 100. Each of the masses of particles 100 includes a plurality of the soft magnetic metal particles 110. According to the present embodiment, the soft magnetic metal particle 110 can be classified into either a first soft magnetic metal particle 110F or a second soft magnetic metal particle 110S, wherein the first soft magnetic metal particle 110F is included in either of the masses of particles 100, and the second soft magnetic metal particle 110S is not included in any of the masses of particles 100. The soft magnetic formed body 10 may include no second soft magnetic metal particle 110S. Moreover, the soft magnetic formed body 10 may include only one of the masses of particles 100.

As can be seen from the above explanation, the first soft magnetic metal particle 110F and the second soft magnetic metal particle 110S are made of the same soft magnetic metal material and have shapes and properties similar to each other. In other words, each of the first soft magnetic metal particle 110F and the second soft magnetic metal particle 110S is the soft magnetic metal particle 110. The soft magnetic metal particles 110 are oriented along the horizontal plane. In detail, each of the soft magnetic metal particles 110 has an upper surface 112 and a lower surface 114 each of which almost extends on the horizontal plane while slightly curved.

Figure 4:
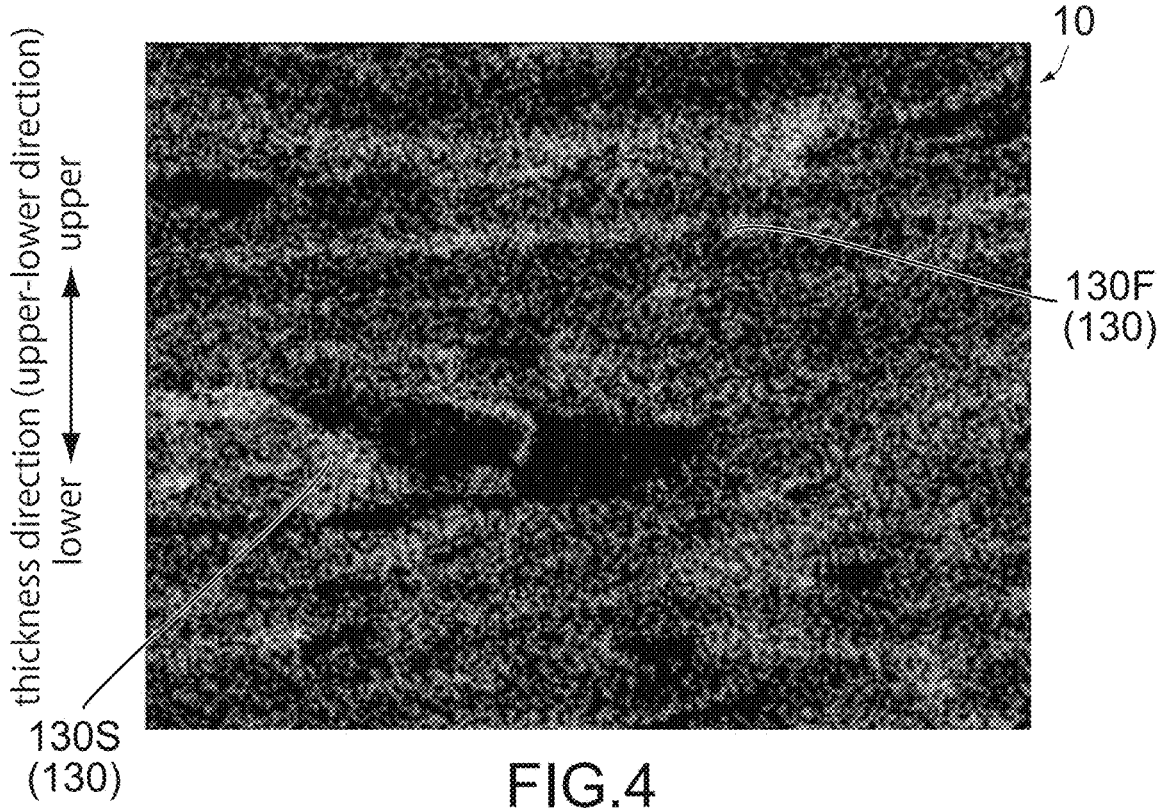
FIG. 4 is another image showing the soft magnetic formed body of FIG. 3, wherein white part in the image shows a binder component, or an inorganic oxide.

Referring to FIGS. 1 and 4, as described later, the binder component 130 is formed by thermosetting a binder 184 (see FIG. 2) which includes inorganic material. In detail, during the thermosetting, the binder 184 (binder component 130) is changed into the binder component 130 having the inorganic oxide as its principal component while parts of the binder component 130 planarly spread along the upper surfaces 112 or the lower surfaces 114 of the soft magnetic metal particles 110 to form first binders 130F (see FIG. 4). At that time, the other parts of the binder 184 (binder component 130) are granulously combined to form second binders 130S (see FIG. 4). In other words, each of the first binders 130F planarly spreads as a whole, while each of the second binders 130S is granulously combined as a whole.

As can be seen from the above explanation, the first binder 130F and the second binder 130S are formed of the common binder 184 (see FIG. 2) and have properties similar to each other. In other words, each of the first binder 130F and the second binder 130S is a part of the binder component 130.

Each of the first binders 130F binds the upper surface 112 or the lower surface 114 of one of the first soft magnetic metal particles 110F included in one of the masses of particles 100 to the lower surface 114 or the upper surface 112 of another one of the first soft magnetic metal particle 110F included in the one of the masses of particles 100. The first binder 130F is thinner than each of the first soft magnetic metal particles 110F. Therefore, the first soft magnetic metal particles 110F included in the same mass of particles 100 are closely gathered to one another. In other words, the mass of particles 100 is a collection of the soft magnetic metal particles 110 which are vertically bound by the first binders 130F to be gathered in high density within the soft magnetic formed body 10.

In detail, two or more of the soft magnetic metal particles 110 that are vertically adjacent to one another work as the first soft magnetic metal particles 110F which form the mass of particles 100. Two of the first soft magnetic metal particles 110F that are vertically adjacent to each other are bound to each other by the first binder 130F so as to extend in parallel to each other with a gap which is smaller than a thickness of each of the two of the first soft magnetic metal particles 110F that are vertically adjacent to each other. Since the soft magnetic formed body 10 is formed of the thus-formed masses of particles 100, the soft magnetic formed body 10 can includes the soft magnetic metal particles 110 of 60 volume % or more.

Each of the second binders 130S binds one of the masses of particles 100 to another one of the masses of particles 100 or the second soft magnetic metal particle 110S so as to form the open pore 150, or a relatively large space, therebetween. In other words, the second binder 130S binds, with a gap, one of the first soft magnetic metal particles 110F included in one of the masses of particles 100 to one of the soft magnetic metal particle 110 which is not included in the one of the masses of particles 100. As a result, the open pore 150 is formed between one of the masses of particles 100 and another one of the masses of particles 100. Moreover, the open pore 150 is formed between one of the masses of particles 100 and the second soft magnetic metal particle 110S.

Moreover, the first soft magnetic metal particles 110F are stacked in the upper-lower direction while shifting their positions to one another in a direction perpendicular to the upper-lower direction. This arrangement forms the open pore 150 between the first soft magnetic metal particles 110F included in the mass of particles 100.

The soft magnetic formed body 10 is formed with the closed pores 160 in addition to the open pores 150. The open pores 150 are connected to one another to open outward of the soft magnetic formed body 10 (not shown). In contrast, each of the closed pores 160 is a small closed space within the soft magnetic formed body 10. The soft magnetic formed body 10 according to the present embodiment barely includes the closed pores 160, while including a large volume of the open pores 150. In other words, according to the present embodiment, almost the whole of the vacancy (space) within the soft magnetic formed body 10 is the open pores 150.

The soft magnetic formed body 10 has properties as described below because of the aforementioned components and structure.

As described above, the soft magnetic formed body 10 according to the present embodiment includes the soft magnetic metal particles 110 of 60 volume % or more. As a result, the soft magnetic formed body 10 has improved magnetic properties. More specifically, the soft magnetic formed body 10 has high saturation magnetic flux density of 0.5 T or more and high permeability like ferrite. The soft magnetic formed body 10 according to the present embodiment is hardly magnetically saturated, so that when the soft magnetic formed body 10 is used to form a magnetic core, the magnetic core can be reduced in size.

According to the present embodiment, the soft magnetic formed body 10 can be formed to have relative permeability with the real number component of 50 or more at a frequency of 1 MHz. Moreover, the real number component of the relative permeability can be 100 or more at the frequency of 1 MHz. In detail, the real number component of the relative permeability within an initial permeability range takes the maximum value (Y) at a predetermined frequency (X MHz) of 1 MHz or more because of magnetic resonance. This predetermined frequency (X MHz) and the maximum value (Y) meet the condition of X×Y≥300. This relation prevents increase of eddy current loss, increase of core loss and degradation of noise absorption properties. In order to further heighten the relative permeability of the soft magnetic formed body 10, the soft magnetic formed body 10 is further preferred to include the soft magnetic metal particles 110 of 70 volume % or more.

As previously described, each of the soft magnetic metal particles 110 is oriented to be in parallel to the horizontal plane. Therefore, the soft magnetic formed body 10 has an axis of easy magnetization which extends along a direction in parallel to the horizontal plane. Thus, in the direction in parallel to the horizontal plane, its demagnetization factor can be lowered, while its relative permeability can be further heightened. In order to further heighten the relative permeability in the direction in parallel to the horizontal plane, the soft magnetic metal particles 110 are preferred to have average aspect ratio of 10 or more.

The soft magnetic metal particle 110 is preferred to be made of Fe based alloy so as to have sufficient magnetic properties. Moreover, the soft magnetic metal particle 110 is preferred to be made of Fe—Si based alloy. Moreover, the soft magnetic metal particle 110 is preferred to be made of Fe—Si—Al based alloy (Sendust) or Fe—Si—Cr based alloy.

When the soft magnetic metal particle 110 contains Si and Al, the ratio of Si in the soft magnetic metal particle 110 is preferred to be between 3 wt % and 18 wt %, both inclusive, and the ratio of Al is preferred to be between 1 wt % and 12 wt %, both inclusive. When the soft magnetic formed body 10 has the aforementioned composition, each of a magnetocrystalline anisotropy constant and a magnetostriction constant of the soft magnetic formed body 10 is lowered, so that the magnetic properties of the soft magnetic formed body 10 are improved.

As previously described, each of the soft magnetic metal particles 110 has a flat shape, and the soft magnetic metal particles 110 are stacked in the upper-lower direction while shifting their positions to one another in the direction in parallel to the horizontal plane. Therefore, even if a crack is caused, expansion of the crack can be prevented. In particular, the break is not expanded in the upper-lower direction. According to the present embodiment, for example, the soft magnetic formed body 10 can be formed so as to have a thickness about 2.0 mm and high toughness (strength) in comparison with ceramic material, or ferrite. The soft magnetic formed body 10 is, unlike the ferrite, hardly to be damaged and hardly to have degraded magnetic properties even under high pressure.

As previously described, the soft magnetic metal particles 110 are bound to one another by the binder component 130 made of inorganic material. Therefore, the soft magnetic formed body 10 is resistible against a reflow soldering under high temperature about 260° C. Moreover, the soft magnetic metal particles 110 are bound to one another by the binder component 130 made of insulator. Therefore, the soft magnetic formed body 10 has superior frequency characteristic and a high electric resistivity of 10 kΩ·cm or more. In other words, the soft magnetic formed body 10 according to the present embodiment has a satisfactory insulation property. Moreover, in a case where the soft magnetic metal particle 110 contains the predetermined amount of Si and Al, a surface of the soft magnetic metal particle 110 is formed with a passive film containing Si and Al when the soft magnetic formed body 10 is formed. As a result, the electric resistivity of the soft magnetic formed body 10 further becomes high.

When the soft magnetic formed body 10 is used to form a magnetic core, the magnetic core has an inductance and an electric resistivity almost equivalent to those of a ferrite core and has DC superimposition characteristics superior to that of the ferrite core. However, when the filling rate of the soft magnetic metal particles 110 is over 85 volume %, the electric resistivity is drastically lowered, and eddy current loss within the inductor becomes large. Therefore, when the soft magnetic formed body 10 is used to form the magnetic core, the soft magnetic formed body 10 is required to include the soft magnetic metal particles 110 of 85 volume % or less.

Moreover, the soft magnetic formed body 10 according to the present embodiment has a thermal conductivity which is higher than that of the ferrite whose conductivity is conventionally considered to be highest. In summary, according to the present embodiment, all of the superior magnetic properties, the high strength, the satisfactory insulation property and the high thermal conductivity can be obtained.

According to the present embodiment, the open pores 150 extend among the masses of particles 100 and the soft magnetic metal particles 110 bound by the binder component 130 to spread all over the soft magnetic formed body 10. As a result, the soft magnetic formed body 10 has elasticity. In detail, the soft magnetic formed body 10 according to the present embodiment has rubber hardness based on ISO7619-typeD between 92 and 96, both inclusive. In other words, the soft magnetic formed body 10 has the high strength while being elastically deformable.

In particular, the soft magnetic formed body 10 according to the present embodiment has elasticity in the upper-lower direction because of the open pores 150 included therewithin and because of elasticity of the flat shape soft magnetic metal particles 110 themselves. This elasticity in the upper-lower direction not only allows the soft magnetic formed body 10 to be easily compressed to a predetermined thickness but also allows the soft magnetic formed body 10 to be easily recovered from the compressed state.

If the open pore ratio is 10 volume % or more, the soft magnetic formed body 10 has the aforementioned elasticity, and the soft magnetic formed body 10 can be easily processed via various methods. If the open pore ratio is 30 volume % or less, the soft magnetic formed body 10 can include a sufficient amount of the soft magnetic metal particles 110. Therefore, the soft magnetic formed body 10 is desired to include the open pores 150 between 10 volume % and 30 volume %, both inclusive, similar to the present embodiment. In other words, the volume ratio (open pore ratio) of the open pores 150 included in the soft magnetic formed body 10 is desired to be between 10 volume % and 30 volume %, both inclusive.

Since the soft magnetic formed body 10 is an elastic body, its Young's modulus can be measured as described below. First, the soft magnetic formed body 10 having a flat plate-like shape of a width (w) and a thickness (t) is prepared. Then, two supported portions of the soft magnetic formed body 10 are supported from below. At that time, the supported portions are apart from each other by a distance (L) in a longitudinal direction of the soft magnetic formed body 10. Then, a pressed portion, which is located between the supported portions in the longitudinal direction, is pressed by a load (P) from above. Then, an extensional strain (δ) caused by the load (P) is measured. As is well known, the Young's modulus can be calculated from the aforementioned width (w), thickness (t), distance (L), load (P) and extensional strain (δ). According to the present embodiment, the soft magnetic formed body 10 having the Young's modulus between 10 GPa and 90 GPa, both inclusive, can be obtained. Moreover, the soft magnetic formed body 10 having the Young's modulus between 20 GPa and 50 GPa, both inclusive, can be obtained by mainly adjusting the open pore ratio of the soft magnetic formed body 10.

A preferable range of the volume ratio of the binder component 130 included in the soft magnetic formed body 10 depends on the density of the binder component 130. Moreover, the density of the binder component 130 is changed depending on the amount of the closed pores 160 included in the binder component 130. According to the present embodiment, the density of the binder component 130 is between 1.3 g/cc and 2.2 g/cc, both inclusive. Under this condition, the soft magnetic formed body 10 is desired to include the binder component 130 between 4 volume % and 30 volume %, both inclusive. In other words, the volume ratio of the binder component 130 included in the soft magnetic formed body 10 is desired to be between 4 volume % and 30 volume %, both inclusive. If the volume ratio of the binder component 130 is less than 4 volume %, the soft magnetic formed body 10 might have insufficient strength. If the volume ratio of the binder component 130 is more than 30 volume %, the volume ratio of the soft magnetic metal particles 110, with the open pore ratio of 10 volume % or more, cannot be 60 volume % or more.

A part of or the whole of a surface of the soft magnetic formed body 10 can be coated with a resin or a glass material. For example, an insulating resin such as acrylic resin or polyolefin resin can be used as this resin. This coating can improve the insulation property and the strength of the soft magnetic formed body 10. As previously described, the open pores 150 are connected to one another and open outward of the soft magnetic formed body 10 (not shown). The soft magnetic formed body 10 can be impregnated with a resin or a glass material via these openings (not shown). In other words, the open pores 150 can be, at least in part, filled with the resin or the glass material. This filling can further improve the insulation property and the strength of the soft magnetic formed body 10.

The open pores 150 can be filled with another inorganic oxide different from that of the binder component 130. For example, if the soft magnetic formed body 10 is subject to heat-treatment under a state where the open pores 150 are, at least in part, impregnated with a solution including an inorganic material such as silicone resin, the inorganic material included in the solution is oxidized to be changed into an inorganic oxide. As a result, a part of or the whole of the open pores 150 is filled with the inorganic oxide different from that of the binder component 130, or different from the inorganic oxide that is included in the soft magnetic formed body 10 prior to the impregnation with the solution including the inorganic material. This process can further improve the insulation property and the strength of the soft magnetic formed body 10.

If the most of or the whole of the open pores 150 is filled with the resin, the glass material or the inorganic oxide, the soft magnetic formed body 10 might lose its elasticity. In a case where the soft magnetic formed body 10 is required to be processed with use of its elasticity, the whole of the open pores 150 may be filled after the process is applied to the soft magnetic formed body 10.

Figure 2:
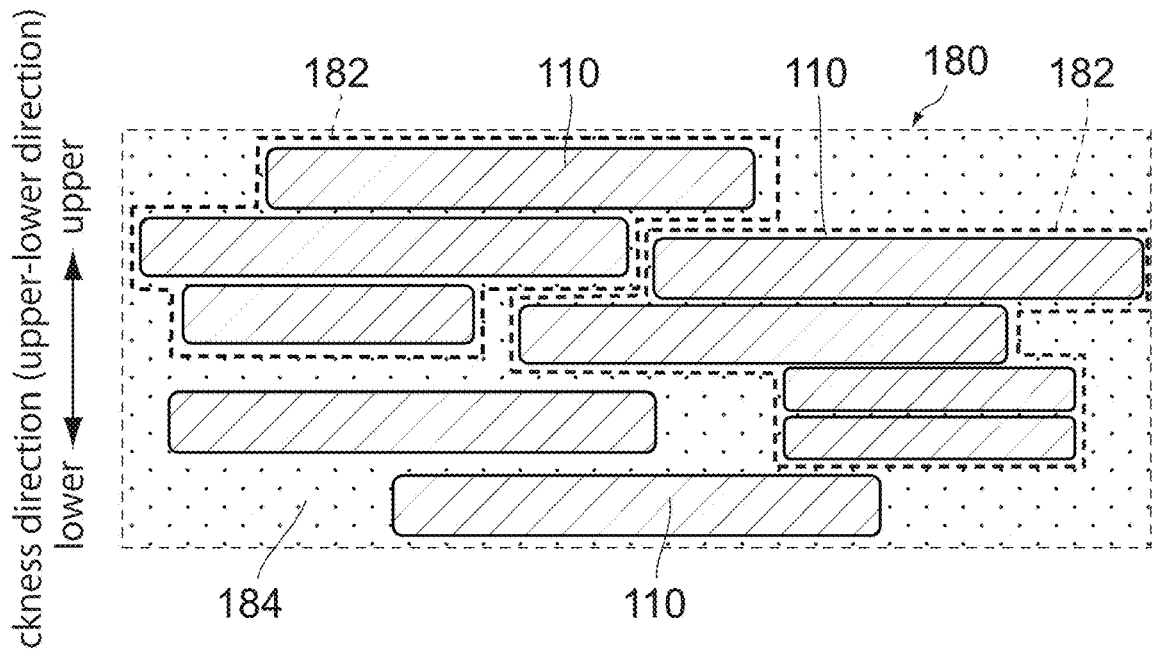
FIG. 2 is a cross-sectional view schematically showing a part of a slurry which is used to form the soft magnetic formed body of FIG. 1.

Hereafter, explanation will be made about an example of forming method of the soft magnetic formed body 10 as referring to FIGS. 1 and 2.

First, the soft magnetic metal particles 110 each having a flat shape is made. For example, granular soft magnetic metal particles (material powder) each made of Fe based alloy are flatten with use of a ball mill, so that the soft magnetic metal particles 110 can be made.

Then, a mixture of a solvent, a viscosity improver and a thermoset binder (binder 184) is made. For example, ethanol and polyacrylic acid ester can be used as the solvent and the viscosity improver, respectively. For example, methyl phenyl silicone resin can be used as the binder 184. When the mixture is made, the solvent, the viscosity improver and the binder 184 are sufficiently mixed so that the homogeneous mixture is made. For example, the mixture is put into a container having a diameter of 150 mm and a liquid level depth of 150 mm. For example, a rotating blade having a diameter length of 100 mm stirs the mixture in the container at a relatively high rotational speed (250 rpm, for example) during a relatively long hours (5 hours, for example), so that the homogeneous mixture can be made.

Then, the soft magnetic metal particles 110 each having a flat shape are put into the sufficiently mixed mixture. The mixture including the soft magnetic metal particles 110 is mixed so that the soft magnetic metal particles 110 are non-uniformly distributed. For example, a rotational speed for stirring of the mixture is lowered to about 100 rpm, or mixing hours are reduced to about 1 hour, so that a slurry 180 is made, wherein the slurry 180 is formed with some aggregates 182 in each of which the soft magnetic metal particles 110 are closely gathered. The aggregates 182 can be formed by another method. For example, the aggregates 182 can be formed by using the solvent and the viscosity improver whose solubility parameters are largely different from each other.

Then, the slurry 180 is applied on a substrate. The applied slurry 180 is heat-treated and the solvent is volatilized, so that a preliminary body, which is material of the soft magnetic formed body 10, is made. Because the preliminary body is not formed of brittle material such as ferrite, the preliminary body can be pressure-molded.

Then, the preliminary body is compressed by pressure, so that a pressure-molded body is made. Each of the aggregates 182 of the soft magnetic metal particles 110 is pressed into a flat shape by the pressure, and the soft magnetic metal particles 110 are almost oriented in the horizontal plane. The pressure-molded body is heat-treated at high temperature such as 600° C., so that the soft magnetic formed body 10 (see FIG. 1) can be obtained. In general, when the preliminary body is compressed by pressure, structural distortion is caused so that the relative permeability might be lowered. However, according to the present embodiment, the relative permeability returns to a high value by the aforementioned heat-treatment at high temperature.

The binder 184 loses its organic component which is decomposed because of the aforementioned heat-treatment at high temperature. As a result, the binder 184 is reduced in weight because of the heating while the binder component 130 is formed. More specifically, the solid content of the methyl phenyl silicone resin is changed into the binder component 130 made of glass material having silicon oxide as its principal component while binding the soft magnetic metal particles 110. In detail, the soft magnetic metal particles 110 in each of the aggregates 182 (see FIG. 2) are bound to one another by the first binders 130F in high density to form the mass of particles 100, and the masses of particles 100 are bound to one another by the second binders 130S with gaps (see FIG. 1). Moreover, the parts filled with the binder 184 are formed with the open pores 150 and the closed pores 160. As can be seen from the above explanation, the desirable open pore ratio can be obtained by adjusting the amount of the binder 184 for making the slurry 180 and the pressure for pressing and compressing the preliminary body.

In general, because different parts of the molded body have temperatures different from one another under the aforementioned heat-treatment at high temperature, the different parts are thermally expanded at different rates. Moreover, the binder 184 shrinks and is decomposed at different rates in the different parts. Therefore, when the pressure-molded body is thick, a large internal stress might be generated to cause a crack and a separation. Moreover, under the aforementioned heat-treatment at high temperature, the decomposition of the binder 184 generates gas in the molded body. When the pressure-molded body is thick, the gas generated in the deep part of the molded body is hardly emitted outward. Therefore, the gas pressure in the molded body might be raised to cause the crack and the separation.

According to the present embodiment, in contrast to the existing technique, the binder 184 in the mixture is homogeneously mixed, while the soft magnetic metal particles 110 are non-homogeneously mixed in the binder 184 and distributed so as to form the aggregates 182. In other words, the binder 184 is homogeneously distributed in the slurry 180, and the soft magnetic metal particles 110 are closely gathered in several parts to form the aggregates 182. Thus, the binder 184 is homogeneously distributed with no interruption of the soft magnetic metal particles 110.

Therefore, under the heat-treatment at high temperature, the binder 184 is almost equally decomposed and almost equally shrinks all over the slurry 180. As a result, the open pores 150 are formed all over the slurry 180 so that the gas generated in the molded body is smoothly emitted outward. According to the present embodiment, the crack and the separation are hardly generated even in a case where the temperature elevation rate is high under the heat-treatment at high temperature and even in another case where the pressure-molded body is thick. More specifically, when the pressure-molded body has a thickness of 2 mm or less, almost no crack and almost no separation are generated even under the aforementioned heat-treatment at high temperature. Thus, the thickness of the pressure-molded body is desired to be 2 mm or less. The thickness of the pressure-molded body is further desired to be 0.7 mm or less.

According to the present embodiment, the open pores 150 are formed all over the slurry 180, so that when the heat-treatment at high temperature is performed under an atmosphere, oxygen is supplied to the center part of the pressure-molded body. This supplied oxygen can reduce deterioration of the electric resistivity which might be caused by remaining coal in the soft magnetic formed body 10.

Because the soft magnetic formed body 10, which is made as described above, is not brittle material such as ferrite, the magnetic core can be made via a simple, precise and reliable joint method such as indentation, placing, press-fitting and forcible press-fitting. For example, when a member is press-fit into a hole of the magnetic core, a part surrounding the hole of the magnetic core is elastically deformed. Therefore, an internal stress caused by the press-fitting is kept from being propagated all over the magnetic core, and the whole of the magnetic core is prevented from being deformed and broken. As can be seen from the above explanation, when the soft magnetic formed body 10 according to the present embodiment is used to form an inductor, flexibility in design of the inductor is dramatically improved so that the inductor having reduced size and high reliability can be made.

Moreover, the present invention is applicable to a magnetic component other than the magnetic core and the inductor. For example, the soft magnetic formed body 10 according to the present invention can be used to make a magnetic sheet for supporting an antenna or another magnetic sheet for suppressing noise.

Hereafter, explanation will be made about a magnetic core and an inductor each of which is made with use of the soft magnetic formed body 10 according to the present embodiment.

Figure 5:
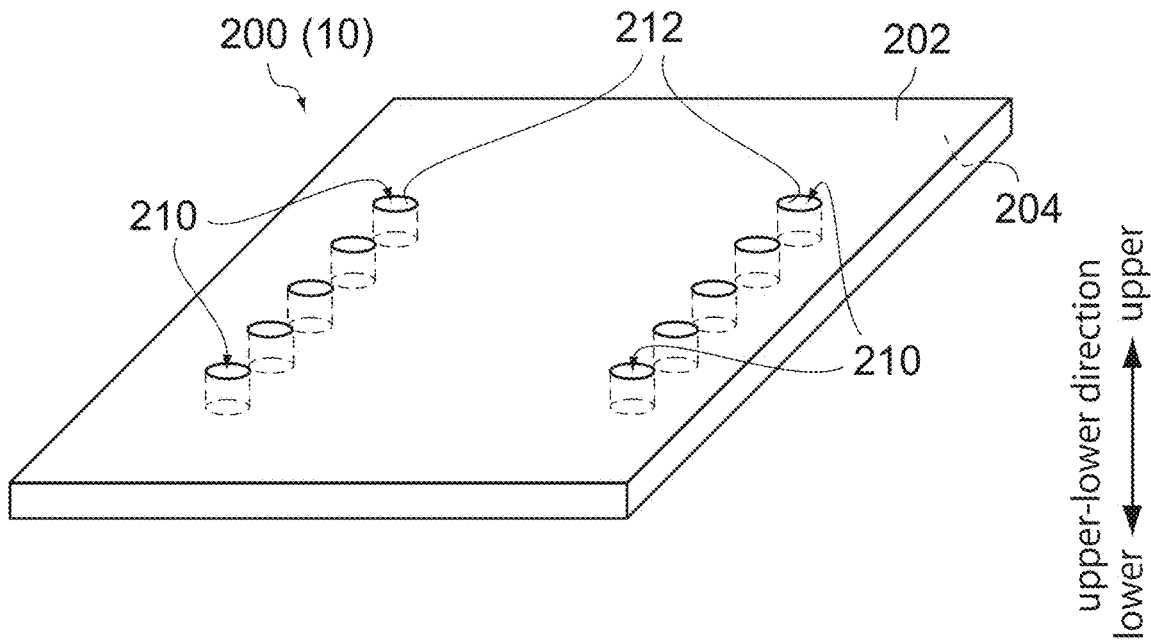
FIG. 5 is a perspective view showing a magnetic core made of the soft magnetic formed body according to the present embodiment, wherein hidden parts of through holes of the magnetic core are illustrated by dashed line.

As shown in FIG. 5, a magnetic core 200 according to the present embodiment is made of the soft magnetic formed body 10 which has a flat plate shape perpendicular to the upper-lower direction. The soft magnetic formed body 10 of flat plate shape has a thickness of 2 mm or less. The magnetic core 200 has an upper surface 202 and a lower surface 204 in the upper-lower direction. The magnetic core 200 is formed with a plurality of through holes 210. Each of the through holes 210 passes through the magnetic core 200 in the upper-lower direction so as to have a cylindrical shape. Each of the through holes 210 is formed with an inner wall 212.

Figure 6:
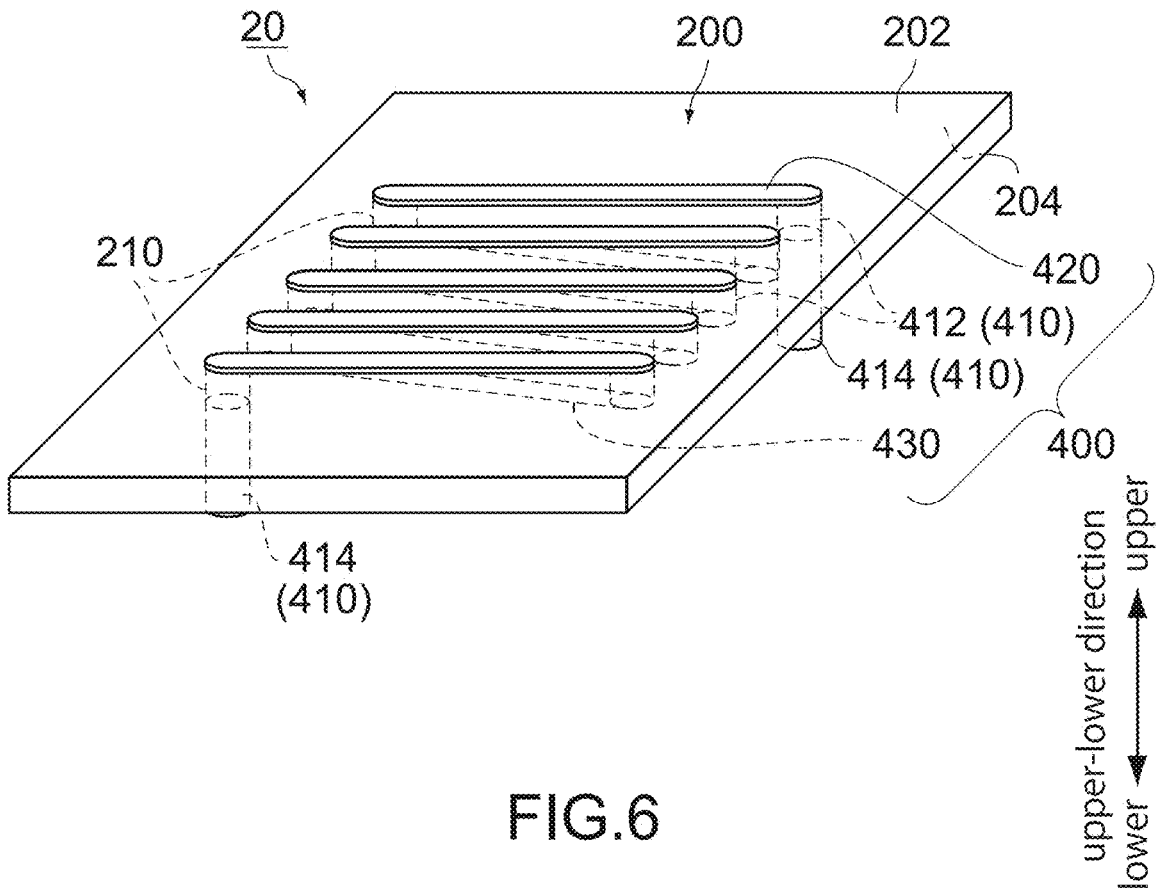
FIG. 6 is a perspective view showing an inductor in which the magnetic core of FIG. 5 is used, wherein hidden parts of a coil of the inductor are illustrated by dashed line.
Figure 7:
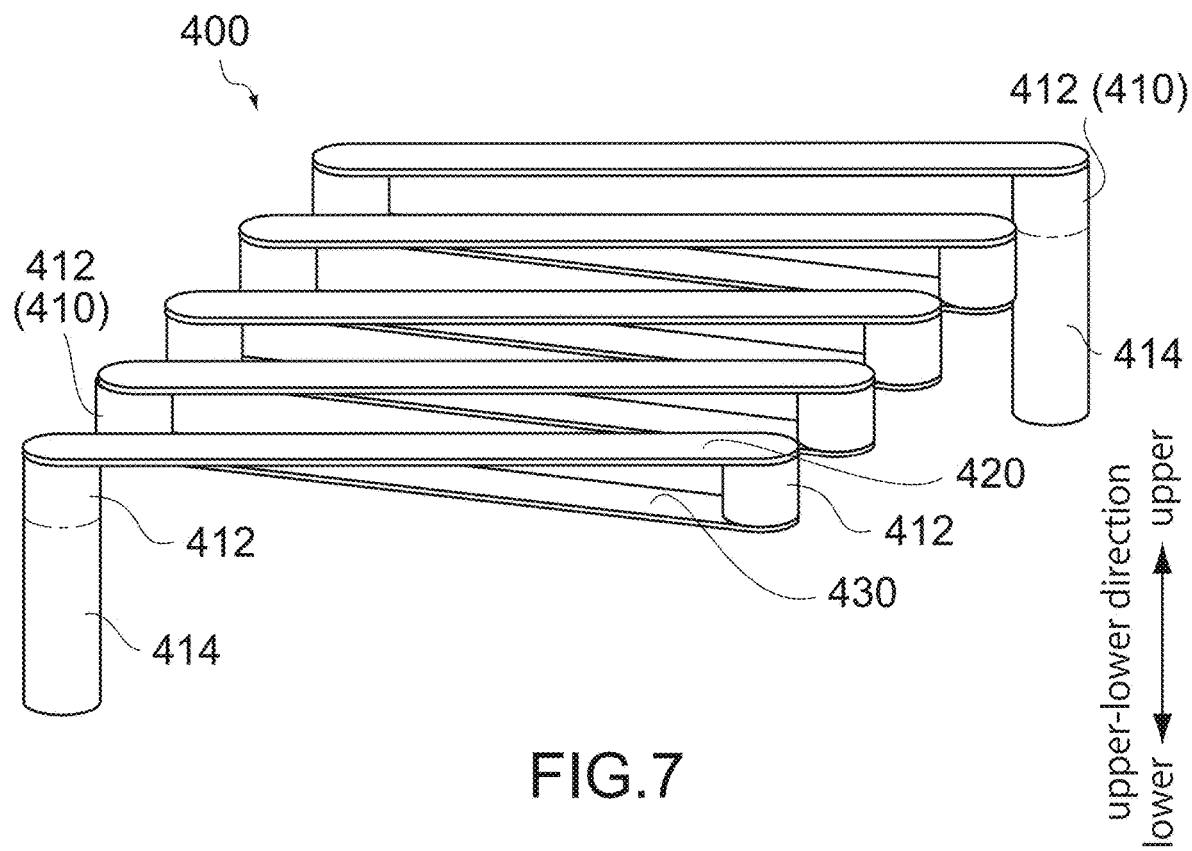
FIG. 7 is a perspective view showing the coil of the inductor of FIG. 6, wherein imaginary lines, each of which is a boundary line between a piercing portion and a connection portion of the coil, are illustrated by chain dotted line.

As shown in FIGS. 6 and 7, an inductor 20 according to the present embodiment comprises the magnetic core 200 and a coil 400 made of metal. The coil 400 has a plurality of via conductors 410, a plurality of first coupling portions (coupling conductors) 420 and a plurality of second coupling portions (coupling conductor) 430. Each of the via conductors 410 has a piercing portion 412. Moreover, each of two of the via conductors 410 extends longer than the other via conductors 410 and has a connection portion 414 in addition to the piercing portion 412. The piercing portions 412, the first coupling portions 420 and the second coupling portions 430 are connected to one another so as to be wound around a part of the magnetic core 200. The connection portions 414 of the two via conductors 410 are connectable to signal lines (not shown), etc. of a circuit board (not shown), respectively.

In detail, the via conductors 410 are inserted into the through holes 210, respectively, and pierce the through holes 210, respectively. According to the present embodiment, this insertion forms two rows of piercing groups each of which includes five of the piercing portions 412. Each of the first coupling portions 420 couples an upper end of one of the piercing portions 412 of one of the piercing groups to an upper end of one of the piercing portions 412 of a remaining one of the piercing groups. Each of the second coupling portions 430 couples a lower end of one of the piercing portions 412 of one of the piercing groups to a lower end of one of the piercing portions 412 of a remaining one of the piercing groups. The first coupling portions 420 and the second coupling portions 430 can be securely fixed to the piercing portions 412 via various method such as resistance welding, ultrasonic welding, etc. to be attached to the magnetic core 200.

The coil 400 is made of metal such as copper with no insulating coating. The magnetic core 200 according to the present embodiment can be directly in contact with the coil 400 made of metal since having sufficient insulation property. However, the coil 400 may have the insulating coating.

Figures 8A, 8B:
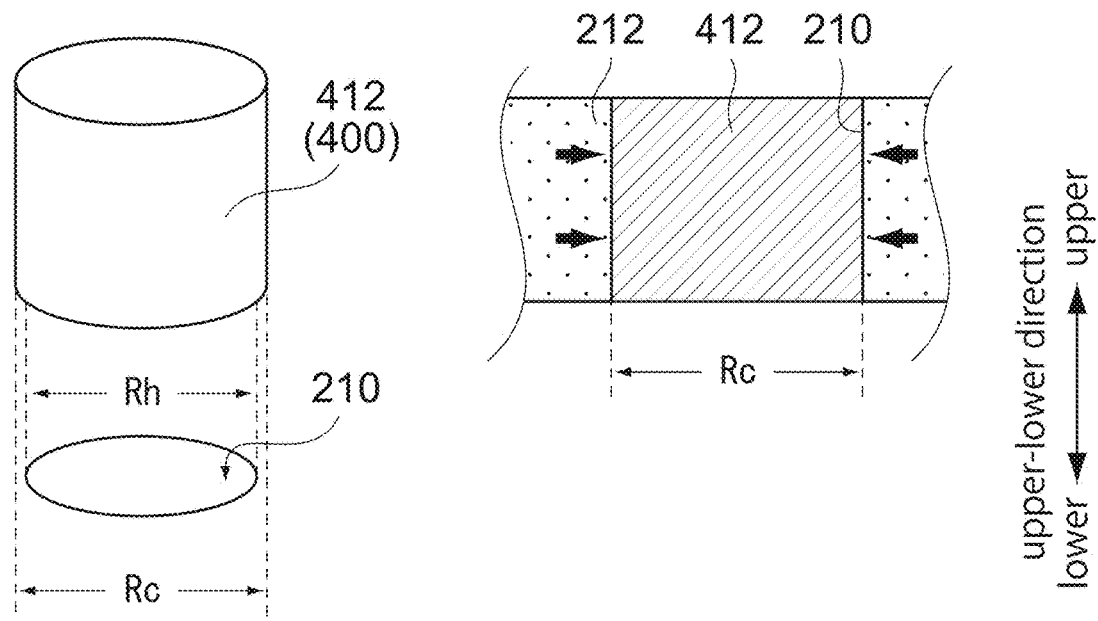
FIG. 8A is a partially enlarged, perspective view showing the through hole of the magnetic core and the piercing portion of the coil of FIG. 6 under a state where the piercing portion is not inserted into the through hole.
FIG. 8B is a partially enlarged, side cross-sectional view showing the through hole of the magnetic core and the piercing portion of the coil of FIG. 6.

As shown in FIGS. 8A and 8B, the piercing portion 412 according to the present embodiment has a cylindrical shape similar to that of the through hole 210. However, a diameter Rc of the piercing portion 412 is slightly larger than a diameter Rh of the through hole 210. Since the magnetic core 200 according to the present embodiment has elasticity, the piercing portion 412 can be inserted into the through hole 210 even in a case where the diameter Rc is larger than the diameter Rh. In another case where the piercing portion 412 has the diameter Rc substantially same as the diameter Rh, the piercing portion 412 can be pressed to be expanded after inserted into the through hole 210, so that the diameter of the piercing portion 412 can be enlarged. A press-fit portion, or the part about the inner wall 212, can be compressed and deformed to some extent. Therefore, the stress generated in the press-fit portion is kept from being propagated all over the magnetic core 200, and the magnetic core 200 is prevented from being deformed and broken.

Referring to FIGS. 6 and 8B, the piercing portion 412, which is inserted in the through hole 210, pierces the through hole 210 while elastically deforming the inner wall 212 of the through hole 210. The elastically deformed inner wall 212 applies a pressing force, or an elastic force, to the piercing portion 412 of the coil 400. This pressing force applied from the inner walls 212 to the piercing portions 412, or to the coil 400, makes the magnetic core 200 hold the coil 400.

As can be seen from the above explanation, the magnetic core 200 according to the present embodiment has proper elasticity which not only allows the insertion of the piercing portion 412 having the diameter larger than that of the through hole 210 but also enables the inserted piercing portion 412 to be securely held. Therefore, the piercing portion 412, which is inserted in the through hole 210, has pulling yield strength with no use of an adhesive agent. In other words, the magnetic core 200 can hold the coil 400 only by the elastic force (pressing force) of the inner walls 212.

Moreover, even in a case where the elastic force of the inner walls 212 is relatively small, the piercing portion 412 and the through hole 210 can be fixed to each other by an adhesive agent which is filled therebetween after the coil 400 is temporarily held by the through hole 210, so that the coil 400 can be securely held. Thus, according to the present embodiment, the coil 400 can be held only by the through holes 210.

Figure 9A:
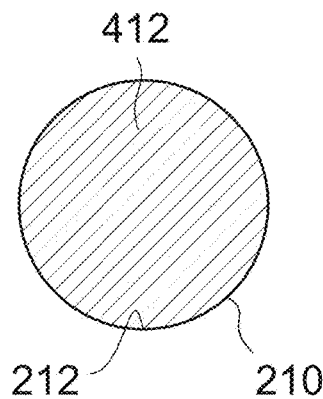
FIG. 9A is a partially enlarged, plan cross-sectional view showing the through hole of the magnetic core and the piercing portion of the coil of FIG. 6.
Figure 9B:
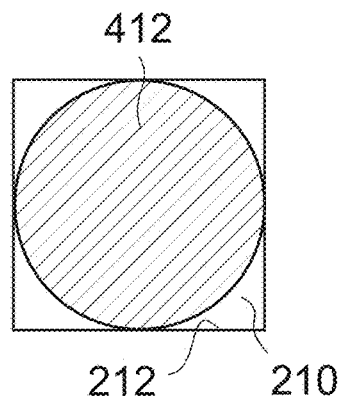
FIG. 9B is a plan cross-sectional view showing a modification of the through hole and the piercing portion of FIG. 9A.
Figure 9C:
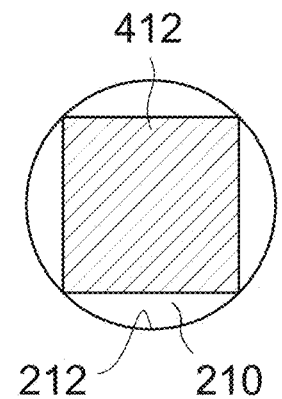
FIG. 9C is a plan cross-sectional view showing another modification of the through hole and the piercing portion of FIG. 9A.

As shown in FIG. 9A, each of the piercing portion 412 and the through hole 210 according to the present embodiment has a circular cross-section. Therefore, the piercing portion 412 inserted in the through hole 210 is securely held by the whole surface of the inner wall 212. However, each of the piercing portion 412 and the through hole 210 may have a cross-sectional shape other than the circular shape, provided that the piercing portion 412 is held by the inner wall 212 at two or more points. For example, as shown in FIG. 9B, the piercing portion 412 may have a circular cross-section, while the through hole 210 may have a rectangular cross-section. Moreover, as shown in FIG. 9C, the piercing portion 412 may have a rectangular cross-section, while the through hole 210 may have a circular cross-section. However, in order to more securely hold the piercing portion 412, the piercing portion 412 and the through hole 210 are preferred to be configured similar to the present embodiment.

Referring to FIG. 6, when the connection portions 414 of the coil 400 are fixed to a circuit board (not shown) to be used, various electronic components (not shown) and the inductor 20 mounted on the circuit board generate heat. According to the present embodiment, the heat generated in the circuit board is conducted to the lower surface 204 of the magnetic core 200 via the connection portions 414 of the coil 400. Since the magnetic core 200 has high thermal conductivity, the heat received by the lower surface 204 is efficiently conducted to the upper surface 202 together with the heat generated in the inductor 20 and is radiated outward from the inductor 20. Thus, according to the present embodiment, the inductor 20 itself, which generates large heat in general, can be used as a radiating member.

Figure 10:
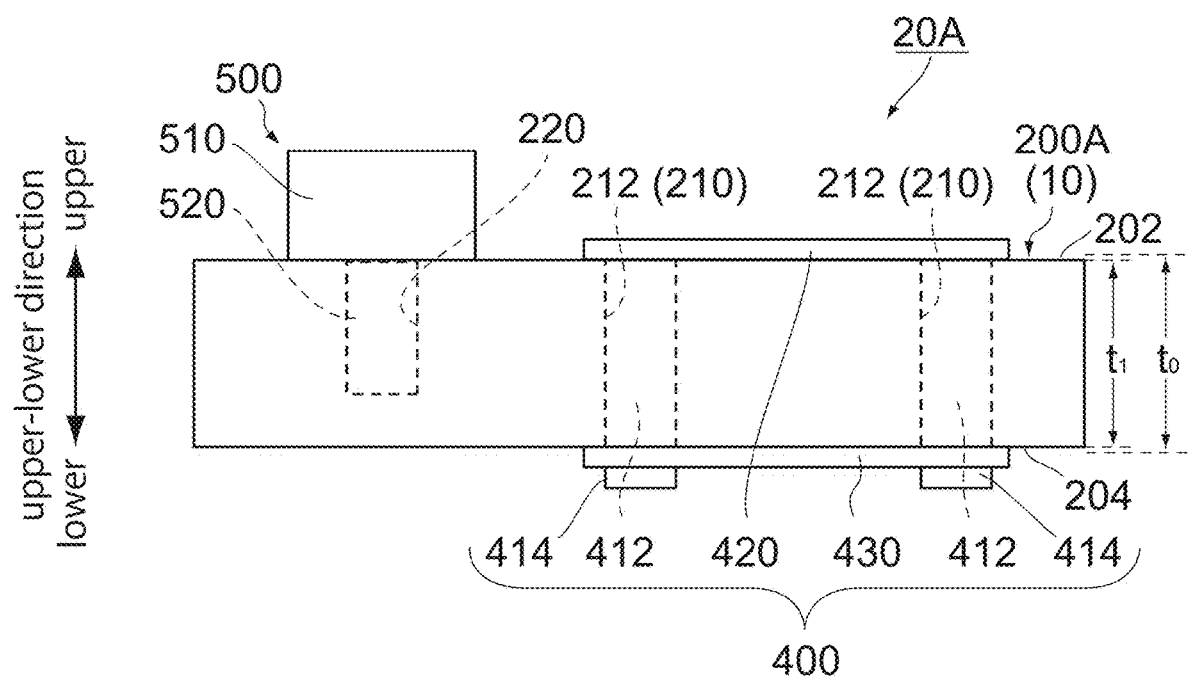
FIG. 10 is a side view showing a modification of the inductor of FIG. 6, wherein hidden parts of the coil and a spacer of the inductor are illustrated by dashed line.

As can be seen from FIGS. 6 and 10, an inductor 20A and a magnetic core 200A are modifications of the inductor 20 and the magnetic core 200. The inductor 20A and the magnetic core 200A have structures and functions similar to those of the inductor 20 and the magnetic core 200. Hereafter, explanation will be made about the inductor 20A and the magnetic core 200A, and mainly about differences from the inductor 20 and the magnetic core 200.

As shown in FIG. 10, the inductor 20A according to the present embodiment comprises the magnetic core 200A, the coil 400 and a spacer 500. The magnetic core 200A is formed by processing the soft magnetic formed body 10 similar to the magnetic core 200.

Similar to the inductor 20 (see FIG. 6), the first coupling portions 420 are attached to the upper surface 202 of the magnetic core 200A, and the second coupling portions 430 are attached to the lower surface 204 of the magnetic core 200A. When the first coupling portions 420 and the second coupling portions 430 are attached to the magnetic core 200A, the magnetic core 200A is compressed as a whole in the upper-lower direction. Therefore, after the first coupling portions 420 and the second coupling portions 430 are attached to the magnetic core 200A, the magnetic core 200A has a thickness (t1) which is reduced between 2.5% and 5.0%, both inclusive, in comparison with a thickness (t0) of the magnetic core 200A prior to the attachment of the first coupling portions 420 and the second coupling portions 430 to the magnetic core 200A. However, if the coil 400 is detached from the magnetic core 200A, the thickness (t1) of the magnetic core 200A is restored so as to be close to the thickness (t0). In other words, the magnetic core 200A almost recovers its reduced thickness, or about 2.5% to 5.0% of the thickness (t0).

When the first coupling portions 420 and the second coupling portions 430 sandwich the magnetic core 200A therebetween, the upper surface 202 and the lower surface 204 are pressed against the first coupling portions 420 and the second coupling portions 430, respectively, by a repulsive force of the magnetic core 200A in the upper-lower direction. Therefore, even if a gap is formed between the piercing portion 412 of the coil 400 and the inner wall 212 of the through hole 210, the first coupling portions 420 and the second coupling portions 430 can be held and fixed.

The magnetic core 200A, which is made of the soft magnetic formed body 10, can securely hold not only the coil 400 but also various members. This processability of the magnetic core 200A is similar to the processability of wood that can be nailed, so that a processing work of the magnetic core 200A is drastically facilitated and reliability of the processing work is improved.

For example, the magnetic core 200A is formed with a holding hole 220. The spacer 500 has a body portion 510 and a held portion 520. In the horizontal plane, the body portion 510 is much larger than the holding hole 220, and the held portion 520 is slightly larger than the holding hole 220. The thus-formed held portion 520 can be press-fit into and fixed to the holding hole 220 similar to the piercing portion 412. When the held portion 520 is press-fit into the holding hole 220, a lower surface of the body portion 510 is brought into contact with the upper surface 202 of the magnetic core 200A. Since the body portion 510 has a large size in the horizontal plane, the body portion 510 prevents dust, which might be produced upon the press-fitting of the held portion 520, from falling off.

Referring to FIGS. 6 and 10, the inductor and the magnetic core according to the present invention can be variously modified. For example, the size of the piercing portion 412 in the horizontal plane may be smaller than the size of the through hole 210 in the horizontal plane. In other words, the piercing portion 412 may be not press-fit into the through hole 210 but may pass through the inside of the through hole 210. In this case, the piercing portion 412 may be fixed to the through hole 210, for example, with use of an adhesive agent. Moreover, each of the first coupling portion 420 and the second coupling portion 430 may be joined to the piercing portion 412 by pressure or may be joined by soldering. Moreover, parts of the magnetic core, which are brought into contact with the first coupling portions 420 and the second coupling portions 430, respectively, may be formed with recesses corresponding to the first coupling portions 420 and the second coupling portions 430, respectively. These recesses make the magnetic core further securely hold each of the first coupling portions 420 and the second coupling portions 430.

Moreover, the magnetic core may comprise a plurality of magnetic core components each of which works as the magnetic core. More specifically, the plurality of the magnetic core components (for example, the magnetic cores 200) may be stacked on one another via adhesive agents to form a single magnetic core. As previously described, the magnetic core according to the present embodiment has a structure which is hardly formed with a crack, so that crack formation is suppressed even when the stacked magnetic core components, or the magnetic core 200, are joined by pressure. For example, a laminated magnetic core having a thickness of more than 2 mm can be obtained while suppressing the crack formation. Each of the thus-stacked magnetic cores 200 may have a thickness of 2 mm or less. However, the thickness of each of the magnetic cores 200 is preferred to be 0.5 mm or less.

EXAMPLES

Hereafter, explanation will be made in further detail about the soft magnetic formed body 10 of the present invention as referring specific examples. First, explanation will be made about a forming method of the soft magnetic formed body 10 according to the present invention.

(Forming of Flat Shaped Particle PA)

Soft magnetic metal particles were used as material having soft magnetism in the soft magnetic formed body 10. More specifically, water atomized particles made of Fe—Si—Cr based alloy were used. The particles included Si of 3.5 wt % and Cr of 2 wt %. Moreover, the particles had an average grain diameter (D50) of 33 μm. The particles were flatten by using a ball-mill. In detail, the particles were subject to 8 hours forging and subsequently subject to 3 hours heat-treatment at 800° C. under a nitrogen atmosphere, so that Fe—Si—Cr particles each having a flat shape (hereafter, referred to as "particles PA") were obtained.

(Forming of First Slurry by First Mixing Method)

The particles PA, a solvent, a viscosity improver and a thermoset binder component are mixed by a first mixing method, or by an existing mixing method, to form a first slurry. Specifically, a mixture of the particles PA, the solvent, the viscosity improver and the thermoset binder component was put into a container which had a diameter of 150 mm and a liquid level depth of 150 mm. The mixture in the container was stirred during 5 hours at a rotational speed of 250 rpm by a rotating blade having a diameter length of 100 mm. Ethanol was uses as the solvent. Polyacrylic acid ester was used as the viscosity improver. Methyl phenyl silicone resin was used as the thermoset binder component. The amount of the polyacrylic acid ester was 3 wt % relative to the particles PA, and the amount of solid content of the methyl phenyl silicone resin was 4 wt % relative to the particles PA.

(Forming of First Preliminary Body)

The first slurry was applied on a film made of PET (polyethylene terephthalate) via slot die coating. Then, the first slurry was dried at temperature of 60° C. for 1 hour to volatilize the solvent, so that a first preliminary body was formed.

(Forming of First Flat Plate)

The first preliminary body was cut by using a trimming die to obtain a plurality of square sheets each of which had a width of 30 mm and a length of 30 mm. A predetermined number of the sheets was stacked and inserted into a metal die. The sheets in the metal die were pressure-molded for 1 hour under temperature of 150° C. by forming pressure of 2 MPa so that a pressure-molded body was obtained. In this forming process, the stack number (predetermined number) of the sheets was changed to form nine types of the molded bodies having various thicknesses, wherein ten bodies were formed per each type. For example, the molded body having a thickness of 1 mm was formed of about thirty sheets. The molded bodies were subject to 2 hours heat-treatment at 550° C. under an atmosphere, so that ten plates were formed for each of nine types of first flat plates having various thicknesses. As a result of this heat-treatment, the viscosity improver was almost completely decomposed and did not remain in the first flat plate. Moreover, as a result of this heat-treatment, the solid content of the methyl phenyl silicone resin was reduced in weight while changed into a binder component after heat-treatment, or a binder component made of glass material containing silicon oxide as its principal component. For example, the heating loss of the solid content of the methyl phenyl silicone resin was 20 wt % after 1 hour heat-treatment at 550° C. under an atmosphere (Forming of Second Slurry by Second Mixing Method)

The particles PA, a solvent, a viscosity improver and a thermoset binder component are mixed by a second mixing method, or by a mixing method of the present invention, to form a second slurry. Specifically, a mixture of the solvent, the viscosity improver and the thermoset binder component was put into a container which had a diameter of 150 mm and a liquid level depth of 150 mm. The mixture in the container was stirred during 5 hours at a rotational speed of 250 rpm by a rotating blade having a diameter length of 100 mm. Then, the particles PA were put into the container. Then, the mixture in the container including the particles PA was stirred during 1 hour at a rotational speed of 100 rpm by the aforementioned rotating blade. The solvent, the viscosity improver and the thermoset binder component are same as those of the first slurry, respectively. Specifically, ethanol was uses as the solvent. Polyacrylic acid ester was used as the viscosity improve. Methyl phenyl silicone resin was used as the thermoset binder component. The amount of the polyacrylic acid ester was 3 wt % relative to the particles PA, and the amount of solid content of the methyl phenyl silicone resin was 4 wt % relative to the particles PA.

(Forming of Second Preliminary Body)

The second slurry was applied on a film made of PET (polyethylene terephthalate) via slot die coating. Then, the second slurry was dried at temperature of 60° C. for 1 hour to volatilize the solvent, so that a second preliminary body was formed.

(Forming of Second Flat Plate)

The second preliminary body was used to form ten plates for each of nine types of second flat plates having various thickness. The forming method of the second flat plate is same as the forming method of the first flat plate except the usage of the second preliminary body instead of the first preliminary body. Therefore, as a result of the heat-treatment for forming the second flat plate, the viscosity improver was almost completely decomposed and did not remain in the second flat plate. Moreover, as a result of this heat-treatment, the solid content of the methyl phenyl silicone resin was reduced in weight while changed into a binder component after heat-treatment, or a binder component made of glass material containing silicon oxide as its principal component.

(Measurement of Open Pore Ratio of First and Second Flat Plates)

A volume of each of the first and second flat plates was measured by a fixed volume expansion method. In this measurement, AccuPyc II of SHIMADZU CORPORATION was used. The volume of the flat plate measured by the fixed volume expansion method did not include the volume of the open pores formed in the flat plate. Another volume of each of the first and second flat plates was measured by Archimedes method. Specifically, each of the first and second flat plates was impregnated with pure water to which a slight amount of surface active agent was added. Then, a buoyant force of each of the first and second flat plates impregnated with the pure water was measured under a state where each of the first and second flat plates was put into pure water. The volume of the flat plate was calculated from the measured buoyant force. The volume of each of the first and second flat plates measured by Archimedes method included the volume of the open pores formed in each of the first and second flat plates. The open pore ratio of each of the first and second flat plates was calculated by using the following first expression.

Open Pore Ratio (%)=(1−Volume Measured by Fixed Volume Expansion Method/Volume Measured by Archimedes Method)×100    First Expression:

(Measurement of Incident Rate of Internal Separation in First and Second Flat Plates)

For each of the first and second flat plates, the thickness after the heat-treatment was compared to the thickness before the heat-treatment. When the thickness after the heat-treatment was thicker than the thickness before the heat-treatment by 3% or more, an internal separation was considered to be generated within the flat plate during the heat-treatment. Incident rate of the internal separation was defined for each type by the number of the flat plates, in each of which the internal separation was generated, to the ten flat plates.

Table 1 shows the open pore ratio and the incident rate of internal separation which were measured as described above.

TABLE 1

| Classification of Flat Plate | Thickness of Flat Plate (mm) | Open Pore Ratio (Volume %) | Incident Rate of Internal Separation (N/10 plates) |
| --- | --- | --- | --- |
| First Flat Plate (Flat Plate of Comparative Example) | 0.4 | 24 ± 1% | 0/10 |
| | 0.6 | | |
| | 0.8 | | |
| | 1.0 | | |
| | 1.2 | | 1/10 |
| | 1.4 | | 1/10 |
| | 1.6 | | 2/10 |
| | 1.8 | | 4/10 |
| | 2.0 | | 5/10 |
| Second Flat Plate (Flat Plate of Example) | 0.4 | 26 ± 1% | 0/10 |
| | 0.6 | | |
| | 0.8 | | |
| | 1.0 | | |
| | 1.2 | | |
| | 1.4 | | |
| | 1.6 | | |
| | 1.8 | | |
| | 2.0 | | |

As shown in Table 1, the second flat plate has the open pore ratio larger than that of the first flat plate and has improved processability. Moreover, even in a case where the thickness of the second flat plate is large, the crack and the separation are prevented from being generated so that the incident rate of internal separation is low. These superior characteristics are obtained by forming the slurry, which is the material of the flat plate, by the second mixing method according to the present invention, or the mixing method of the present invention. According to the present invention, the slurry is mixed so as to form the aggregates of the particles PA each having a flat shape when the slurry is formed, so that the flat plate can be formed to be thick, more easily processed and more hardly damaged Hereafter, explanation will be made in further detail about the open pores included in the soft magnetic formed body as referring to specific examples.

(Forming of Flat Shaped Particle PB)

Soft magnetic metal particles were used as material having soft magnetism in the soft magnetic formed body 10. More specifically, gas atomized particles made of Fe—Si—Al based alloy, or Sendust, were used. The particles had an average grain diameter (D50) of 55 μm. The particles were subject to 8 hours forging with use of a ball-mill, so that Sendust particles each having a flat shape (hereafter, referred to as "particles PB") were obtained.

(Forming of Third Slurry by Third Mixing Method)

The particles PB, a solvent, a viscosity improver and a thermoset binder component were mixed by a third mixing method similar to the second mixing method, or by the mixing method of the present invention, to form a third slurry. Specifically, a mixture formed of the solvent, the viscosity improver and the thermoset binder component was put into a container which had a diameter of 150 mm and a liquid level depth of 150 mm. The mixture in the container was stirred during 5 hours at a rotational speed of 250 rpm by a rotating blade having a diameter length of 100 mm.

Then, the particles PB were put into the container. Then, the mixture in the container including the particles PB was stirred during 1 hour at a rotational speed of 100 rpm by the aforementioned rotating blade. Ethanol was uses as the solvent. Polyacrylic acid ester was used as the viscosity improver. Methyl phenyl silicone resin was uses as the thermoset binder component. In this forming process, eleven different amounts, which were varied between 2 wt % and 16 wt % relative to the particles PB, were used for the amount of the solid content of the methyl phenyl silicone resin.

(Forming of Third Preliminary Body)

The third slurries were applied on films made of PET (polyethylene terephthalate) via slot die coating, respectively. Then, the third slurries were dried at temperature of 60° C. for 1 hour to volatilize the solvent, so that eleven types of third preliminary bodies, which were different from one another in the amount of the methyl phenyl silicone resin, were formed.

(Forming of Third Flat Plate)

The third preliminary bodies were used to form fifteen plates for each of eleven types of third flat plates. Specifically, each of the third preliminary bodies was cut by using a trimming die to obtain a plurality of square sheets each of which had a width of 10 mm and a length of 10 mm. A predetermined number of the sheets, each of which includes the same amount of the methyl phenyl silicone resin, were stacked and inserted into a metal die. The sheets in the metal die were pressure-molded for 1 hour under temperature of 150° C. by forming pressure of 2 MPa so that a pressure-molded body was obtained. In this forming process, eleven types of the molded bodies having different amounts of the methyl phenyl silicone resin were formed, wherein fifteen bodies were formed per each type. The molded bodies were subject to 1 hour heat-treatment at 600° C. under a nitrogen atmosphere, so that fifteen plates were formed for each of the eleven types of the third flat plates having different amounts of the methyl phenyl silicone resin. Each of the third flat plates had a thickness of 1.8 mm. As a result of this heat-treatment, the viscosity improver was almost completely decomposed and did not remain in the third flat plate. Moreover, as a result of this heat-treatment, the solid content of the methyl phenyl silicone resin was reduced in weight while changed into a binder component after heat-treatment, or a binder component made of glass material containing silicon oxide as its principal component. For example, the heating loss of the solid content of the methyl phenyl silicone resin was 20 wt % after 1 hours heat-treatment at 600° C. under an atmosphere.

(Measurement of Open Pore Ratio, Etc. of Third Flat Plate)

A volume of each of the third flat plates was measured by the fixed volume expansion method similar to the measurement of the first and second flat plates. In this measurement, AccuPyc II of SHIMADZU CORPORATION was used. Another volume of each of the third flat plates was measured by Archimedes method similar to the measurement of the first and second flat plates. The open pore ratio of each of the third flat plates was calculated by using the aforementioned first expression. Moreover, the volume filling ratio of the particles PB, or metal components, was calculated while the true density of the particles PB by themselves was assumed to be 6.9 g/cm$^3$.

(Measurement of Incident Rate of Internal Separation, Etc. in Third Flat Plate)

For each of the third flat plates, the thickness after the heat-treatment was compared to the thickness before the heat-treatment. When the thickness after the heat-treatment was thicker than the thickness before the heat-treatment by 3% or more, an internal separation was considered to be generated within the third flat plate during the heat-treatment. Incident rate of internal separation was defined for each type by the number of the third flat plates, in each of which the internal separation was generated, to the fifteen third flat plates. Then, each of the third flat plates, in which the internal separation was not generated, was held at a height of 750 mm so that the upper and lower surfaces thereof horizontally extend. Each of the third flat plates was dropped on a steel sheet, and occurrence ratio of breaking was measured. In this drop test, the third flat plate was considered to be broken when broken and separated into a plurality of pieces. For example, in a case where the third flat plate was partially deformed because of the impact of the drop but was not separated, the third flat plate was not considered to be broken.

Table 2 shows the result of the aforementioned measurement.

TABLE 2

| Amount of Methyl Phenyl Silicone Resin (Weight %) | Volume Filling Ratio of Metal Component (Volume %) | Open Pore Ratio (Volume %) | Incident Rate of Internal Separation (N/15 plates) | Occurrence Rate of Breaking in Drop Test (N/15 plates) |
| --- | --- | --- | --- | --- |
| 2 | 58 | 35 | 0/15 | 3/15 |
| 2.5 | 63 | 31 | | 0/15 |
| 3 | 71 | 23 | | |
| 4 | 70 | 22.5 | | |
| 5 | 68.5 | 20 | | |
| 6 | 64 | 16 | | |
| 8 | 61 | 12.5 | | |
| 10 | 57 | 11.5 | | |
| 12 | 55 | 9 | | |
| 14 | 54 | 7.5 | 1/15 | 0/14 |
| 16 | 51 | 6 | 4/15 | 0/11 |

As shown in Table 2, when the open pore ratio is 7.5 volume % or less, the internal separation is generated during the heat-treatment. In this case where the open pore ratio is 7.5 volume % or less, the internal separation is considered to be generated because of the reason that the open pores are not sufficiently included in the flat plate so that there is no maintained passage through which the pyrolysis gas generated during the heat-treatment can be discharged outward. Moreover, in another case where the open pore ratio is 35 volume %, the third flat plate has insufficient strength to be broken in the drop test. In contrast, in still another case where the open pore ratio is between 9 volume % and 31 volume %, both inclusive, the preferable result is obtained.

The above explanation is merely about the examples of the present invention, and an organic binder such as the viscosity improver and the thermoset binder component is not limited to that of the aforementioned examples. The specific organic binder may be properly selected depending on the soft magnetic metal particle. Moreover, the amount of the organic binder may be properly adjusted depending on the soft magnetic metal particle. For example, when the amount of the thermoset binder component is adjusted in proportion to the surface area of the soft magnetic metal particles, preferable result similar to those of the aforementioned examples can be obtained.

The present application is based on a Japanese patent application of JP2014-053771 filed before the Japan Patent Office on Mar. 17, 2014, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST 10 soft magnetic formed body
100 mass of particles
110 soft magnetic metal particle (soft magnetic metal material)
110F first soft magnetic metal particle
110S second soft magnetic metal particle
112 upper surface
114 lower surface
130 binder (binder component)
130F first binder
130S second binder
150 open pore (vacancy)
160 closed pore (vacancy)
180 slurry
182 aggregate
184 binder
20, 20A inductor
200, 200A magnetic core
202 upper surface
204 lower surface
210 through hole
212 inner wall
220 holding hole
400 coil
410 via conductor
412 piercing portion
414 connection portion
420 first coupling portion (coupling conductor)
430 second coupling portion (coupling conductor)
500 spacer
510 body portion
520 held portion

The invention claimed is:

1. A soft magnetic formed body in which a binder component binds soft magnetic metal particles each having a flat shape, wherein:
the soft magnetic metal particles are at least 60 volume % of the soft magnetic formed body;
open pores are between 10 volume % and 30 volume %, both inclusive, of the soft magnetic formed body;
the binder component includes an inorganic oxide as a principal component thereof; and
the open pores are connected to one another to open outward of the soft magnetic formed body.

2. The soft magnetic formed body as recited in claim 1, wherein:
the soft magnetic formed body includes one or more masses of particles;
each of the one or more masses of particles includes a plurality of the soft magnetic metal particles; and
a part of the binder component planarly spreads to bind an upper surface or a lower surface of one of the soft magnetic metal particles included in one of the masses of particles to a lower surface or an upper surface of another one of the soft magnetic metal particles included in the one of the masses of particles.

3. The soft magnetic formed body as recited in claim 2, wherein another part of the binder component is granulously combined to bind, with a gap, one of the soft magnetic metal particles included in one of the masses of particles to one of the soft magnetic metal particles which is not included in the one of the masses of particles.

4. The soft magnetic formed body as recited in claim 1, wherein:
two or more of the soft magnetic metal particles that are vertically adjacent to one another are first soft magnetic metal particles which form a mass of particles;
the soft magnetic formed body includes one or more of the masses of particles; and
two of the first soft magnetic metal particles that are vertically adjacent to each other are bound to each other by the binder component so as to extend in parallel to each other with a gap which is smaller than a thickness of each of the two of the first soft magnetic metal particles that are vertically adjacent to each other.

5. The soft magnetic formed body as recited in claim 4, wherein one of the masses of particles is bound to another one of the masses of particles or to a second soft magnetic metal particle so as to form one of the open pores therebetween, the second soft magnetic metal particle being a soft magnetic metal particle that is not included in any of the masses of particles.

6. The soft magnetic formed body as recited in claim 1, wherein a surface of the soft magnetic formed body is, at least in part, coated with a resin or a glass material.

7. The soft magnetic formed body as recited in claim 6, wherein the open pores are, at least in part, filled with a resin or a glass material.

8. The soft magnetic formed body as recited in claim 1, wherein the open pores are, at least in part, impregnated with a solution including an inorganic material and subjected to heat-treatment, so that the open pores are, at least in part, filled with an inorganic oxide different from the inorganic oxide that is included in the soft magnetic formed body prior to impregnation with the solution including the inorganic material.

9. A magnetic core made of the soft magnetic formed body as recited in claim 1.

10. A magnetic sheet made of the soft magnetic formed body as recited in claim 1.

* * * * *